United States Patent
Domnick et al.

(10) Patent No.: US 10,648,086 B2
(45) Date of Patent: May 12, 2020

(54) METHOD AND SYSTEM FOR PRODUCING COATED STEEL COMPONENTS

(71) Applicant: MAGNA INTERNATIONAL INC., Aurora (CA)

(72) Inventors: Ralph Domnick, Buckenhof (DE); Mathias Belzner, Cadolzburg (DE); Edward Schleichert, Sailauf (DE)

(73) Assignee: MAGNA INTERNATIONAL INC., Aurora (CA)

(*) Notice: Subject to any disclaimer, the term of this patent is extended or adjusted under 35 U.S.C. 154(b) by 573 days.

(21) Appl. No.: 15/302,812

(22) PCT Filed: Apr. 17, 2015

(86) PCT No.: PCT/CA2015/000251
§ 371 (c)(1),
(2) Date: Oct. 7, 2016

(87) PCT Pub. No.: WO2015/157850
PCT Pub. Date: Oct. 22, 2015

(65) Prior Publication Data
US 2017/0029956 A1    Feb. 2, 2017

(30) Foreign Application Priority Data

Apr. 17, 2014 (DE) .......... 10 2014 207 447

(51) Int. Cl.
C23C 14/10      (2006.01)
C23C 28/04      (2006.01)
(Continued)

(52) U.S. Cl.
CPC ........ C23C 28/048 (2013.01); C23C 14/0036 (2013.01); C23C 14/0042 (2013.01);
(Continued)

(58) Field of Classification Search
CPC .............. C23C 28/048; C23C 14/0036; C23C 14/0042; C23C 14/022; C23C 14/0652;
(Continued)

(56) References Cited

U.S. PATENT DOCUMENTS

| 4,568,614 A | 2/1986 | Eichen et al. |
| 6,475,354 B1 | 11/2002 | Toyama |
| 2009/0214882 A1* | 8/2009 | Sakakura ............... B32B 27/16 428/447 |

FOREIGN PATENT DOCUMENTS

| CA | 2029755 A1 | 5/1991 |
| CA | 2096735 A1 | 5/1992 |

(Continued)

OTHER PUBLICATIONS

Ortner, K., et al., Dynamic PACVD Coating of Strip Metal With Silicon Oxide, Titanium Oxide and Amorphous Carbon Films, Science Direct, Surface & Coatings Technology 200, Feb. 23, 2005, pp. 976-979.

(Continued)

*Primary Examiner* — Jonathan C Langman
(74) *Attorney, Agent, or Firm* — Dickinson Wright PLLC

(57) ABSTRACT

A coated steel component is provided. The coated steel component includes a substrate composed of a steel sheet which can be supplied to a hot-forming process. The coated steel component also possesses a non-metallic coating on the basis of silicon, in a layered structure. The layered structure includes three functional layers having the composition $SiO_xN_yC_z$, wherein x lies between 30 and 70%, y lies between 0 and 35%, and z lies between 0 and 50%.

12 Claims, 2 Drawing Sheets

(51) Int. Cl.
  *C23C 14/06* (2006.01)
  *C23C 14/56* (2006.01)
  *C23C 14/00* (2006.01)
  *C23C 14/02* (2006.01)
  *C23C 14/34* (2006.01)
  *C21D 9/46* (2006.01)

(52) U.S. Cl.
  CPC ........ *C23C 14/022* (2013.01); *C23C 14/0652* (2013.01); *C23C 14/0664* (2013.01); *C23C 14/0676* (2013.01); *C23C 14/10* (2013.01); *C23C 14/3407* (2013.01); *C23C 14/562* (2013.01); *C21D 9/46* (2013.01)

(58) Field of Classification Search
  CPC . C23C 14/0664; C23C 14/0676; C23C 14/10; C23C 14/3407; C23C 14/562; C21D 9/46
  See application file for complete search history.

(56) References Cited

FOREIGN PATENT DOCUMENTS

| CN | 101333642 A | 12/2008 |
| CN | 102485955 A | 6/2012 |
| KR | 102004056507 A | 7/2004 |
| WO | 2011101158 A1 | 8/2011 |
| WO | 2013166429 A1 | 11/2013 |

OTHER PUBLICATIONS

Fan, et al., A Study on Multifunctional Protective Coating for Hot Stamping of Ultra High-Strength Steel, International Conference on Advanced Technology of Design and Manufacture 2010 (ADTM 2010), IET Conference Publications 576, Nov. 23-25, 2010, pp. 436-438, Beijing, China.

* cited by examiner

METHOD AND SYSTEM FOR PRODUCING COATED STEEL COMPONENTS

CROSS REFERENCE TO PRIOR APPLICATIONS

This U.S. National Stage Patent Application claims priority to PCT patent application no. PCT/CA2015/000251, filed Apr. 17, 2015 entitled "Method and System for Producing Coated Steel Components", which claims the benefit of and priority to German Patent Application No. DE 102014207447.9 filed Apr. 17, 2014, the entire disclosures of the applications being considered part of the disclosure of this application and hereby incorporated herein by reference.

TECHNICAL FIELD

The invention relates to a steel component having a non-metallic, silicon based coating, and to a method and system for producing coated steel components using reactive cathode atomization.

BACKGROUND

Motor vehicle components are often produced by means of hot-forming a cold-rolled or hot-rolled steel sheet. Examples of such automotive steel products are vehicle columns, supports, bumpers, rocker panels, fuel tank assemblies, door frames, and components such as parts of the floor of the motor vehicle. Hot-forming is carried out at a temperature greater than 700° C. and often includes a step of hot-stamping the steel sheet. Hot-forming increases the mechanical strength and improves other physical properties of the steel sheet.

The high temperatures that are used during hot-forming lead to the formation of oxide layers on the steel sheets, which can result in scale and corrosion, or decarbonization of the surface of the steel sheets, and thereby reduce the mechanical strength of the steel sheets and cause increased wear on the forming tools during hot-forming. These surface effects also lead to poor adhesion characteristics, making it difficult to paint the surface of the resulting component. Subjecting the hot molded steel part to shot-blasting removes the surface defects, also but requires a high degree of energy and may negatively affect other properties of the component.

A coating for a steel component is known from WO2013166429, which coating uses a non-metallic layer of at least silicon and carbon, in order to improve the surface effects before and during the hot-forming process and, if applicable, to prevent them from arising in the first place. The non-metallic coating has a plurality of individual layers, preferably one to three different layers. The layers together have a total thickness of not more than 300 nm, and preferably not more than 100 nm.

It would desirable to simplify the layer system for series production, and to minimize the layer structure in the respective layer thickness, without losing the desired properties.

SUMMARY

According to at least one embodiment, a layer system is formed on a steel component, the layer system having the following properties:

a) Metal-free, i.e. the coating does not contain any metals, alloys, and also no metallic components in compounds, for example no metal oxides, metal nitrides such as $Al_2O_3$ or $TiO_2$.

b) The coating contains only compounds having the form $NMO_xN_yC_z$, with x, y, z indicating the relative contents of the individual elements O (=oxygen), N (=nitrogen), C (=carbon). NM stands for a non-metal, for example silicon.

c) The coating is composed of one or more layers, which do not exceed a total layer thickness of 100 nm, preferably 50 nm.

d) The coating demonstrates very good adhesion to the steel surface.

e) The coating is resistant to high temperatures and can be worked at high temperatures (e.g., several hundreds of degrees Celsius, particularly between 800° C. and 1000° C.), for example can be formed along with the steel substrate.

f) The coating itself is corrosion-resistant and also protects the steel surface provided with this coating against corrosion, because of its impermeability.

g) The coating can be applied on large-series production systems and can therefore be applied to large amounts of steel that is present either as a strip or as flat steel sheets, in cost-advantageous manner, with great process stability and layer stability.

h) Great thermal resistance, good corrosion protection and scale behavior, good forming behavior after tempering, and very good adhesion properties to steel surfaces.

i) Good compatibility in connection with KTL (cathodic dip painting) top coat.

j) Low friction resistance (minimum requirement: untreated steel plate).

k) High absorption in the IR range, in order to achieve a short heating-up time.

This task is accomplished with a coated steel component, wherein a substrate composed of steel sheet can be supplied to a hot-forming process and possesses a non-metallic coating on the basis of silicon, in a layered structure, and wherein three functional layers having the composition $SiO_xN_yC_z$ are present, wherein x lies between 30 and 70%, y lies between 0 and 35%, and C lies between 0 and 50%.

According to at least one embodiment the steel component has an adhesion-imparting layer, a diffusion barrier, and a third layer, which is structured in such a manner, in a preferred embodiment, that this third layer is similar to the first adhesion-imparting layer.

According to at least one embodiment almost no nitrogen is present in the adhesion-imparting layer (1) and in the third layer (3).

According to at least one embodiment, a carbon content of ≠0 to 50% is present in the third layer.

According to at least one embodiment a nitrogen content of 34% is present in the diffusion barrier (2).

According to at least one embodiment transitions (11) with gradients of nitrogen content are present in between the layers.

According to at least one embodiment, a method for producing a coated component, using reactive cathode atomization, can be carried out with the following steps: preparing (40) the substrate (10), cleaning the substrate with a plasma (41), applying the layers (42, 43, 44), removing (45) the substrate.

According to at least one embodiment the method steps (41 to 44) take place in a process chamber.

According to at least one embodiment the method steps (42 to 44) take place under the same process pressure and require only a single target (silicon).

According to at least one embodiment, a further target (carbon) is required in the method step 44, i.e. applying the third layer.

According to at least one embodiment the method steps (41 to 44) use only the process gases argon, oxygen, and nitrogen, in different concentrations.

In some embodiments the production system for carrying out the method is an in-line system or a roll-to-roll system.

In accordance with an aspect of at least one embodiment, there is provided a coated steel component, comprising: a steel substrate; and a non-metallic, silicon-based layered coating structure, comprising: a first functional layer formed directly on the steel substrate; a second functional layer formed directly on the first functional layer; and a third functional layer formed directly on the second functional layer, wherein the composition of each functional layer is SiOxNyCz, wherein each functional layer comprises between 30 and 70% (by atomic %) O, between 0 and 35% (by atomic %) N, and between 0 and 50% (by atomic %) C, and wherein the composition of the second functional layer is different than the composition of both the first functional layer and the third functional layer.

In accordance with an aspect of at least one embodiment, there is provided a method for producing a coated component, comprising: providing a steel substrate; cleaning the steel substrate with a plasma; using reactive cathode atomization, applying a non-metallic layered coating structure onto the cleaned steel substrate, comprising: applying a first functional layer applied directly onto the cleaned steel substrate; applying a second functional layer applied directly onto the first functional layer; and applying a third functional layer applied directly onto the second functional layer, wherein the composition of each functional layer is SiOxNyCz, wherein each functional layer comprises between 30 and 70% (by atomic %) O, between 0 and 35% (by atomic %) N, and between 0 and 50% (by atomic %) C, and wherein the composition of the second functional layer is different than the composition of both the first functional layer and the third functional layer.

BRIEF DESCRIPTION OF THE DRAWINGS

The following description shows example embodiments.

DETAILED DESCRIPTION OF EXAMPLE EMBODIMENTS

Figure 1:
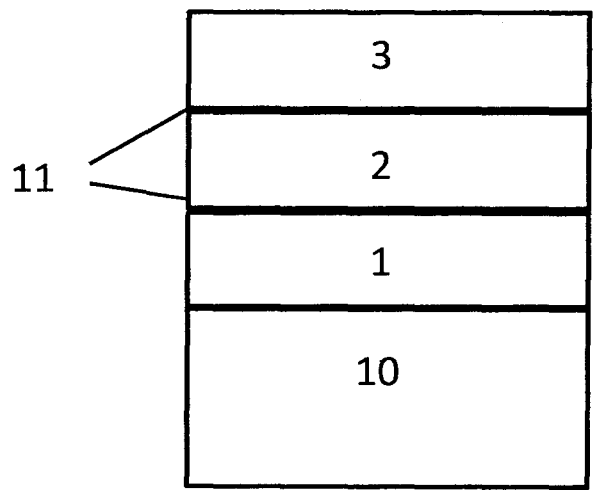
FIG. 1 shows a layer structure.
Figure 2:
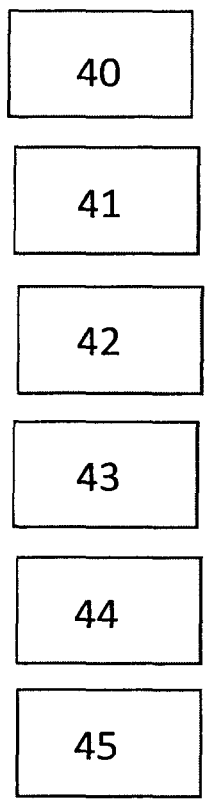
FIG. 2 schematically shows the process sequence.

FIG. 1 shows a metal-free three-layer system including silicon, oxygen, nitrogen, and in some embodiments carbon. Three layers 1, 2, 3 are applied to a substrate 10. The composition of each functional layer is SiOxNyCz, wherein each functional layer comprises between 30 and 70% (by atomic c/o) oxygen, between 0 and 35% (by atomic c/o) nitrogen, and between 0 and 50% (by atomic %) carbon. The balance of the composition of each functional layer being silicon.

The first layer, $SiOx1[Ny1][Cz1]$, is an adhesion-imparting layer 1 between the substrate surface and the subsequent diffusion barrier 2. The composition of the first layer is substantially SiOx, but may include 0-5 atomic % nitrogen. The presence of nitrogen during deposition of the first layer improves its adhesion properties and has a process-stabilizing and process-accelerating effect, and optimizes the forming behavior of the total layer composite. The carbon content amounts to 0%.

The thin $SiOx1[Ny1][Cz1]$ layer at the beginning is necessary to guarantee good adhesion of the thin-layer system on the steel surface. In particular, this layer allows circumventing plasma cleaning, glow discharge, heating or other cleaning of the substrate in a vacuum, which is normally necessary to ensure good adhesion to the substrate surface. As a result, the total investment costs for a corresponding production system are saved, and the production times are shortened.

The second layer is the diffusion barrier 2. The layers are applied one after the other, wherein the transition between the materials is not allowed to take place abruptly, but rather must demonstrate a gradient. After completion of the first layer, a transition region 11 having a thickness of a few nanometers is generated by closing the oxygen valve during the production process, in which region the oxygen content is continuously reduced at a predetermined gradient, until the second layer, the diffusion barrier layer 2 in the composite, $SiOx2Ny2[Cz2]$ has been deposited; the composition of the second layer corresponds substantially to SiOx, with a high content of nitrogen. The carbon content amounts to 0%. The continuous transition between SiOx in the first layer and SiOx[N] in the second layer leads to very good adhesion of the two compounds to one another. Furthermore, in this way an apparatus for gas separation, which would cause additional costs, is eliminated. Because of its density, the second layer essentially has the function of a diffusion barrier, as corrosion protection and scale protection. The oxygen content in this second layer reduces its "density," but at the same time, it reduces its "brittleness" and thereby improves the forming behavior of the component, without causing detachment of the layer.

In addition, if a certain oxygen content is accepted in this layer, the production process can be simplified in that it is possible to do without gas separation in the production systems.

Furthermore, the oxygen content in this layer also improves the adhesion to the third and last layer 3, $SiOx3[Ny3][Cz3]$ or $SiOx2Ny3Cz3$. In an embodiment A1, this third layer has a composition very similar to the first layer, and essentially corresponds to SiOx. The carbon content is 0%.

Here, the properties and advantages correspond to those of the first layer 1. In addition, very good adhesion to cathodic dip coating surfaces and a reduction in the friction behavior of the total layer system come about.

In a further embodiment A2, the third layer is configured differently from the first layer, and has a carbon content of up to 50%. Due to the carbon content of the third layer, it is possible to achieve very good adhesion with regard to subsequent cathodic dip coating treatment.

Furthermore, the absorption properties of the coating can be influenced as a function of the coating.

The individual layers are defined by the parameters thickness and chemical composition, as indicated below.

Layer thicknesses of the total layer system should be less than 100 nm; in an embodiment the layer thicknesses amount to 50 nm.

In this connection, the individual layer thicknesses, in an advantageous embodiment A1, amount to:

First layer, adhesion-imparting layer 1: $SiOx1[Ny1][Cz1]$= 5-40 nm, preferably approximately 10 nm, Second layer, diffusion barrier $SiOx2[Ny2][Cz2]$=5-80 nm, preferably approximately 20 nm, Third layer SiOx3[Ny3][Cz3]=5-20 nm, preferably approximately 15 nm.

The chemical composition (in atomic %) amounts to the following in the advantageous embodiment A1:

SiOx1[Ny1][Cz1]≈SiOx3[Ny3][Cz3]: silicon=32%, oxygen=68%, nitrogen=0%, carbon=0%, (it is to be understood that nitrogen may be present in the first and third functional layers, at least at the ppm level). SiOx2Ny2[Cz2]: silicon=37%, oxygen=30%, nitrogen=34%, carbon=0%.

In this connection, the individual layer thicknesses, in a further embodiment A2, amount to:

First layer, adhesion-imparting layer 1: SiOx1[Ny1][Cz1]=5-40 nm, preferably approximately 10 nm, Second layer, diffusion barrier SiOx2Ny2[Cz2]=5-80 nm, preferably approximately 20 nm, Third layer SiOx3Ny3Cz3=5-20 nm, preferably approximately 15 nm.

The chemical composition (in atomic %) amounts to the following in the further embodiment A2:

SiOx1[Ny1][Cz1]: silicon=32%, oxygen=68%, nitrogen=0%, carbon=0%, (it is to be understood that nitrogen may be present in the first and third functional layers, at least at the ppm level).

SiOx2Ny2[Cz2]: silicon=37%, oxygen=30%, nitrogen=34%, carbon=0%,

SiOx3Ny3Cz3: silicon=32%, oxygen <68%, nitrogen >0%, carbon max. 50%.

Suitable coating systems are used for producing the coating, in which systems the method can be carried out. In this connection, the following example of a system is not intended to be limiting; a person skilled in the art can also use any other system for producing the coating. An in-line system or a roll-to-roll system can be used, with which the coating is applied to a steel surface by means of reactive sputtering. In-line systems are designed in linear manner: The charging/coating movement takes place linearly from one coating process to another, in separate chambers, which can possibly be separated by means of slides. Installation of the pass-through system is simple, and it is extremely well suited for producing hard layers. In the roll-to-roll method, the substrate foil wound up onto a roll, i.e. the steel sheet, is brought in by way of a charging chamber, then unwound, coated, and wound back up in the discharge chamber during the course of the process.

All non-stainless steels are possible as steel substrates. In the case of an in-line system, shown in FIG. 3a, the steel sheets, having a size of up to approximately 3×6 meters and a thickness of up to 30 mm, are introduced into the system in the form of magazines 20. Up to 10 sheets lie on top of one another in a magazine 20, and in this way can be supplied to the coating process directly one after the other, by way of a suitable apparatus, in that they are moved along horizontally under or between the sputter targets.

Figure 3A:
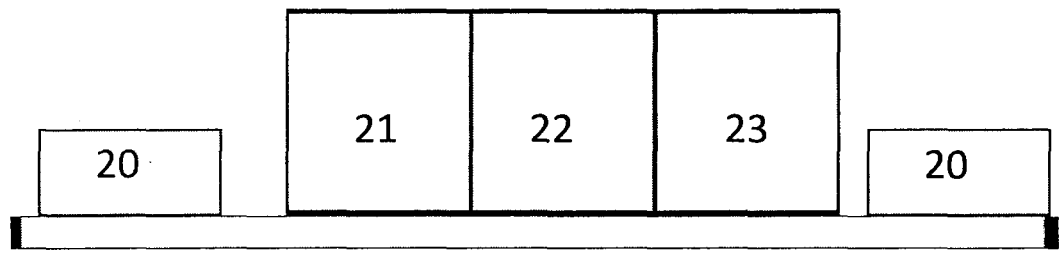
FIGS. 3a, 3b each show a production system for the method.

Referring still to FIG. 3a, the in-line system is built up of at least three vacuum chambers 21, 22, 23 separated from one another by vacuum valves. The magazines with the steel sheets are individually introduced, at first into the first vacuum chamber 21, in which evacuation to a pressure less than 20 mPa takes place.

Then, the valve to the second vacuum chamber 22 is opened, and the magazine is transported into the second vacuum chamber 22, in which the plasma surface cleaning of the steel sheets and the subsequent coating process itself take place.

After introduction of the magazine 20 into the second vacuum chamber 22, the valve to the second vacuum chamber 22 is closed, and the first vacuum chamber 21 is ventilated, in order to be able to accept the next magazine from the outside. In the second vacuum chamber 22, the steel sheets are plasma-cleaned and coated, directly one after the other, and subsequently stacked flat on top of one another again, in the form of a magazine. It is also possible to do without the plasma cleaning. After the coating process in the second vacuum chamber 22, the valve to the third vacuum chamber 23 is opened, which chamber was previously evacuated to a pressure of of 20 mPa or less, and the magazine with the coated steel sheets is transported into the third vacuum chamber 23, the valve to the second vacuum chamber 22 is closed, and the third vacuum chamber 23 is ventilated, in order to be able to remove the magazine with the finished, coated steel sheets from it. A person skilled in the art will select any suitable solution for the structure of the magazines and for the structure of the system.

Figure 3B:
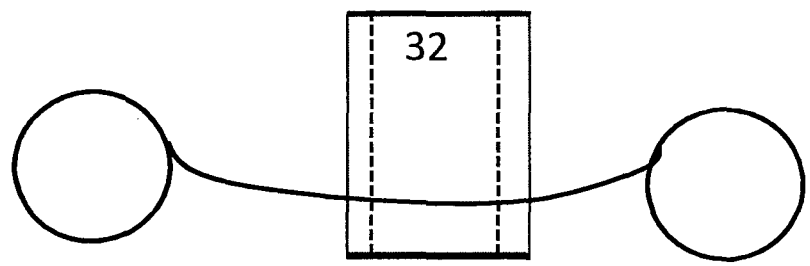

A second system variant, shown in FIG. 3b, is a roll-to-roll coating system, into which the steel substrate to be coated is introduced as a strip material and continuously coated as it passes through the system.

Either the entire wound-up steel strip material is situated in a vacuum, or the wind-up unit and unwinding unit for the steel strip are situated outside of the vacuum chamber having the sputter unit. The vacuum chamber or the chambers have to be designed accordingly. When using a wind-up/unwinding unit 30, 31 outside of the vacuum chamber 32, the strip material is introduced and discharged through narrow air locks having sealing lips, so that the partial vacuum in the vacuum chamber can be kept low, in almost stable manner.

For the production of the total layer system, only silicon targets and argon, oxygen, as well as nitrogen as process gases are required for the first advantageous embodiment A1. For the further embodiment form A2, in which the carbon content in the third layer amounts to ≠0%, additional carbon targets are required.

In this connection, the actual coating process takes place in one chamber. The steel surface to be coated must be kept dust-free and grease-free before the process.

Subsequently, the steel surface to be coated is activated in a plasma consisting of argon, nitrogen or oxygen, or of a mixture of these gases, and cleaned of surface absorbers. Alternatively, the "cleaning" method step can be eliminated.

Embodiment A1

The first layer, the adhesion-imparting layer 1, is selected as a SiOx1[Ny1][Cz1] compound, which guarantees optimal adhesion to the steel surface. This first layer is applied with the following parameters, by means of cathodic atomization:

Ar=300 mm, N2=30 mm, O2=80 mm;
P=2.84 W/cm2;
layer thickness=approximately 12 nm
(mln=milliliters normal, P=pressure in W/cm2).

For the subsequent layer, the diffusion barrier 2 SiOx2Ny2[Cz2], the process parameter settings are selected in such a manner that a very smooth, fine-grained layer structure is obtained, which is very tight and therefore protects against corrosion:

Ar=300 mm, N2=100 mln
P=2.84 W/cm2;
layer thickness=approximately 20 nm.

The third layer SiOx3[Ny3][Cz3] is subsequently applied with the following parameters:

Ar=300 mln, N2=50 mln, O2=50 mln;
P=2.84 W/cm2;
layer thickness=approximately 15 nm.

It can be seen that all the layers are deposited at the same process pressure and that only the composition of the process gases changes. As a result, the entire sequence can take place in one sputter system, without interruptions and continuously.

In the production of the embodiment A2, the first and the second layer are applied with the process parameters indicated above.

The third layer SiOx3Ny3Cz3 is subsequently applied with the following parameters:
Ar=300 mln, N2=60 mln
P(Si)=2.84 W/cm2; surface output for silicon as the target
P(C)=3.5 W/cm2; surface output for carbon as the target
layer thickness=approximately 15 nm.

For support or alternatively, the corrosion protection property can also be achieved or improved in that the cathodes are not all directed vertically at the steel surface, but rather are slightly inclined relative to the vertical—with the effect that more uniform layer growth is made possible.

Another possibility for achieving or improving corrosion resistance involves installing an apparatus for mechanical, static surface cleaning between two cathodes, in each instance—to the effect that a type of cloth or metal apron or plastic apron is passed over the surface while the steel substrates are being moved along in the coating chamber.

As a result, a change in the partially coated surface is brought about—to the effect that the pinholes that might have formed during the preceding coating process do not propagate, but rather are closed, and new pinholes that might form in the following layer form on regions of the preceding layer that are already tight.

As a result, a tighter and therefore more corrosion-resistant layer is produced, on the whole.

Because of the low total layer thickness, inherent layer stresses are avoided almost completely, and forming of the coated steel sheets does not represent a problem.

In the production of the embodiment A1, only one target material is required to implement the desired coating. Likewise, complicated gas separation between the sputter sources is eliminated.

The mechanical and chemical resistance of the coating is achieved in that exclusively ceramic materials are used.

After a preparation step 40, in which the substrate is cleaned, the substrate is introduced into the actual process chamber, the vacuum chamber. Here, in a first process step 41, the surface of the substrate is cleaned using a plasma. Alternatively, cleaning can be eliminated. In three consecutive process steps 42 to 44, the layers 1, 2, 3 are produced, wherein the steps make a transition into one another and a progression of the material concentrations between the layers takes place.

In the last step 45, the substrate is removed from the process chamber.

In summary, it can be stated that the thin-layer system described here can completely replace conventional corrosion-protection layers for steel surfaces. By means of the technology used, reactive cathode atomization, very environmentally friendly production is also achieved, which also lies in a competitive range with regard to the aspect of production costs.

The invention claimed is:

1. A coated steel component, comprising:
a steel substrate; and
a non-metallic, silicon-based layered coating structure, comprising:
a first functional layer formed directly on the steel substrate;
a second functional layer formed directly on the first functional layer; and
a third functional layer formed directly on the second functional layer,
wherein each functional layer comprises 30 to 70% (by atomic %) O, 0 to 35% (by atomic %) N, and 0 to 50% (by atomic %) C,
wherein the composition of the second functional layer is different than the composition of both the first functional layer and the third functional layer,
the second functional layer includes more nitrogen than the first functional layer,
the second functional layer includes less oxygen than the first functional layer, and
the second functional layer includes a gradual reduction of oxygen from the first functional layer to the third functional layer.

2. The coated steel component according to claim 1, wherein the first functional layer is an adhesion-imparting layer, the second functional layer is a diffusion barrier, and the third functional layer has a composition similar to the composition of the first functional layer.

3. The coated steel component according to claim 1, wherein the atomic % of N in the first functional layer and in the third functional layer is 0%.

4. The coated steel component according to claim 1, wherein the third functional layer has a composition different from that of the first layer, and comprising greater than 0% C (by atomic %) and greater than 0% N (by atomic %).

5. The coated steel component according to claim 1, comprising transition zones between the first functional layer and the second functional layer, and between the second functional layer and the third functional layer, the transition zones including gradients of nitrogen content between the functional layers.

6. The coated steel component according to claim 1, comprising transition zones between the first functional layer and the second functional layer, and between the second functional layer and the third functional layer, the transition zones including gradients of oxygen content between the functional layers.

7. A coated steel component, comprising:
a steel substrate; and
a non-metallic, silicon-based layered coating structure, comprising:
a first functional layer formed directly on the steel substrate;
a second functional layer formed directly on the first functional layer;
a third functional layer formed directly on the second functional layer;
each functional layer comprising 30 to 70% (by atomic %) O, 0 to 35% (by atomic %) N, and 0 to 50% (by atomic %) C; and
wherein the composition of the second functional layer is different than the composition of both the first functional layer and the third functional layer, and wherein the composition of the second functional layer is 34% N (by atomic %).

8. A coated steel component wherein a substrate composed of steel sheet can be supplied to a hot-forming process and possesses a non-metallic coating on the basis of silicon, in a layered structure, wherein three functional layers are present, each functional layer comprises 30 to 70% (by atomic %) O, 0 to 35% (by atomic %) N, and 0 to 50% (by atomic %) C, the layers include a diffusion layer, and wherein a nitrogen content of 34% is present in the diffusion barrier.

9. A coated steel component according to claim 8, wherein the functional layers comprise an adhesion-imparting layer, a diffusion barrier, and a third layer, similar to the adhesion-imparting layer.

10. A coated steel component according to claim 8, wherein the third layer has a structure different from that of the first layer, and has a carbon content and a nitrogen content.

11. A coated steel component according to claim 8, wherein transitions having gradients of nitrogen contents are present in between the layers.

12. A coated steel component according to claim 8, wherein transitions having gradients of oxygen contents are present in between the layers.

\* \* \* \* \*